(12) United States Patent
Sandhu

(10) Patent No.: US 9,087,874 B2
(45) Date of Patent: *Jul. 21, 2015

(54) METHODS OF FORMING GRAPHENE-CONTAINING SWITCHES

(71) Applicant: Micron Technology, Inc., Boise, ID (US)

(72) Inventor: Gurtej S. Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 315 days.

This patent is subject to a terminal disclaimer.

(21) Appl. No.: 13/763,662

(22) Filed: Feb. 9, 2013

(65) Prior Publication Data
US 2013/0157420 A1    Jun. 20, 2013

Related U.S. Application Data

(63) Continuation of application No. 13/191,192, filed on Jul. 26, 2011, now Pat. No. 8,394,682.

(51) Int. Cl.
*H01L 21/479* (2006.01)
*H01L 21/82* (2006.01)
(Continued)

(52) U.S. Cl.
CPC .......... *H01L 21/768* (2013.01); *H01L 29/1606* (2013.01); *H01L 29/66022* (2013.01); *H01L 29/66742* (2013.01); *H01L 29/7788* (2013.01); *H01L 29/78642* (2013.01); *H01L 29/78684* (2013.01); *H01L 23/525* (2013.01);
(Continued)

(58) Field of Classification Search
USPC ................... 438/131, 132, 466–469
See application file for complete search history.

(56) References Cited

U.S. PATENT DOCUMENTS

| 7,687,308 B2 | 3/2010 | Parikh et al. |
| 7,939,404 B2 | 5/2011 | Jang |

(Continued)

FOREIGN PATENT DOCUMENTS

WO PCT/US2012/044484    1/2013

OTHER PUBLICATIONS

"Bilayer Graphene Gets a Bandgap", Berkeley Lab, Lawrence Berkeley National Laboratory, Jun. 10, 2009, retrieved online from http://newscenter.lbl.gov/news-releases/2009/06/10/graphene-bandgap/ on Feb. 14, 2011.

(Continued)

*Primary Examiner* — Karen Kusumakar
(74) *Attorney, Agent, or Firm* — Wells St. John P.S.

(57) ABSTRACT

Some embodiments include methods of forming graphene-containing switches. A bottom electrode may be formed over a base, and a first electrically conductive structure may be formed to extend upwardly from the bottom electrode. Dielectric material may be formed along a sidewall of the first electrically conductive structure, while leaving a portion of the bottom electrode exposed. A graphene structure may be formed to be electrically coupled with the exposed portion of the bottom electrode. A second electrically conductive structure may be formed on an opposing side of the graphene structure from the first electrically conductive structure. A top electrode may be formed over the graphene structure and electrically coupled with the second electrically conductive structure. The first and second electrically conductive structures may be configured to provide an electric field across the graphene structure.

15 Claims, 14 Drawing Sheets

(51) Int. Cl.

| | | |
|---|---|---|
| | *H01L 21/332* | (2006.01) |
| | *H01L 21/768* | (2006.01) |
| | *H01L 29/16* | (2006.01) |
| | *H01L 29/786* | (2006.01) |
| | *H01L 29/66* | (2006.01) |
| | *H01L 29/778* | (2006.01) |
| | *H01L 23/525* | (2006.01) |
| | *H01L 23/532* | (2006.01) |
| | *H01L 29/06* | (2006.01) |

(52) U.S. Cl.
CPC ....... *H01L23/53276* (2013.01); *H01L 29/0665* (2013.01); *H01L 29/0676* (2013.01)

(56) References Cited

U.S. PATENT DOCUMENTS

| | | | |
|---|---|---|---|
| 7,947,247 | B2 | 5/2011 | Tennent et al. |
| 7,951,351 | B2 | 5/2011 | Ma et al. |
| 8,268,695 | B2 | 9/2012 | Kiehlbauch et al. |
| 2007/0165442 | A1 | 7/2007 | Hosoi et al. |
| 2007/0187694 | A1* | 8/2007 | Pfeiffer ................. 257/76 |
| 2009/0020764 | A1 | 1/2009 | Anderson et al. |
| 2009/0256129 | A1 | 10/2009 | Scheuerlein |
| 2010/0038730 | A1 | 2/2010 | Sandhu et al. |
| 2010/0102292 | A1* | 4/2010 | Hiura et al. ................. 257/9 |
| 2010/0176366 | A1 | 7/2010 | Fu et al. |
| 2010/0187588 | A1 | 7/2010 | Kim et al. |
| 2010/0213435 | A1 | 8/2010 | Fujii et al. |
| 2010/0214012 | A1 | 8/2010 | Raza |
| 2011/0006837 | A1 | 1/2011 | Wang et al. |
| 2011/0070726 | A1 | 3/2011 | Dickenscheid et al. |
| 2011/0101308 | A1 | 5/2011 | Avouris et al. |
| 2011/0101309 | A1 | 5/2011 | Lin et al. |
| 2011/0156009 | A1 | 6/2011 | Manning et al. |
| 2011/0240946 | A1 | 10/2011 | Miao et al. |
| 2011/0253969 | A1 | 10/2011 | Dai et al. |
| 2012/0115295 | A1 | 5/2012 | Lin et al. |
| 2012/0153119 | A1 | 6/2012 | Patil et al. |
| 2012/0230128 | A1 | 9/2012 | Sandhu |

OTHER PUBLICATIONS

Echtermeyer et al., "Nonvolatile Switching in Graphene Field-Effect Devices", IEEE Electron Device Letters, vol. 29(8), Aug. 2008.

Kim et al., "Realization of a High Mobility Dual-gated Graphene Filed Effect Transistor with Al20 Dielectric", Applied Physics Leters, vol. 94, 062107 (2009). Retrieved online from http://arxiv.org/abs/0901.2901 on Feb. 14, 2011.

Li et al., "Chemically Deprived, Ultrasmooth Graphene Nanoribbon Semiconductors", Science Magazine, vol. 319, Feb. 29, 2008, pp. 1229-1232.

Sui et al., "Screening and Interlayer Coupling in Multilayer Graphene Field-Effect Transistors", Nano Letters 2009, vol. 9(8), pp. 2973-2977. American Chemical Society. Published on Web Jul. 29, 2009.

Tang et al., "A tunable phonon-exciton Fano system in bilayer graphene", Nature Nanotechnology Letters, vol. 5, Jan. 2010. Published online Nov. 15, 2009.

Zhang et al., "Direct observation of a widely tunable bandgap in bilayer graphene", Nature Letters, vol. 45, Jun. 2009.

\* cited by examiner

METHODS OF FORMING GRAPHENE-CONTAINING SWITCHES

RELATED PATENT DATA

This patent resulted from a continuation of U.S. patent application Ser. No. 13/191,192, which was filed Jul. 26, 2011, which issued as U.S. Pat. No. 8,394,682, and which is hereby incorporated herein by reference.

TECHNICAL FIELD

Methods of forming graphene-containing switches.

BACKGROUND

A switch is a component utilized to reversibly open and close a circuit. A switch may be considered to have two operational states, with one of the states being an "on" state and the other being an "off" state. Current flow through the switch will be higher in the "on" state that in the "off" state, and some switches may permit essentially no current flow in the "off" state. Switches may be utilized anywhere in an integrated circuit where it is desired to reversibly open and close a portion of the circuit.

It would be desirable to develop improved methods for fabricating switches suitable for utilization in integrated circuitry, and it would be further desirable to develop improved methods for forming switches suitable for utilization as select devices in memory devices (such as memory arrays).

DETAILED DESCRIPTION OF THE ILLUSTRATED EMBODIMENTS

Some embodiments pertain to methods of forming graphene-containing switches.

Figure 1:
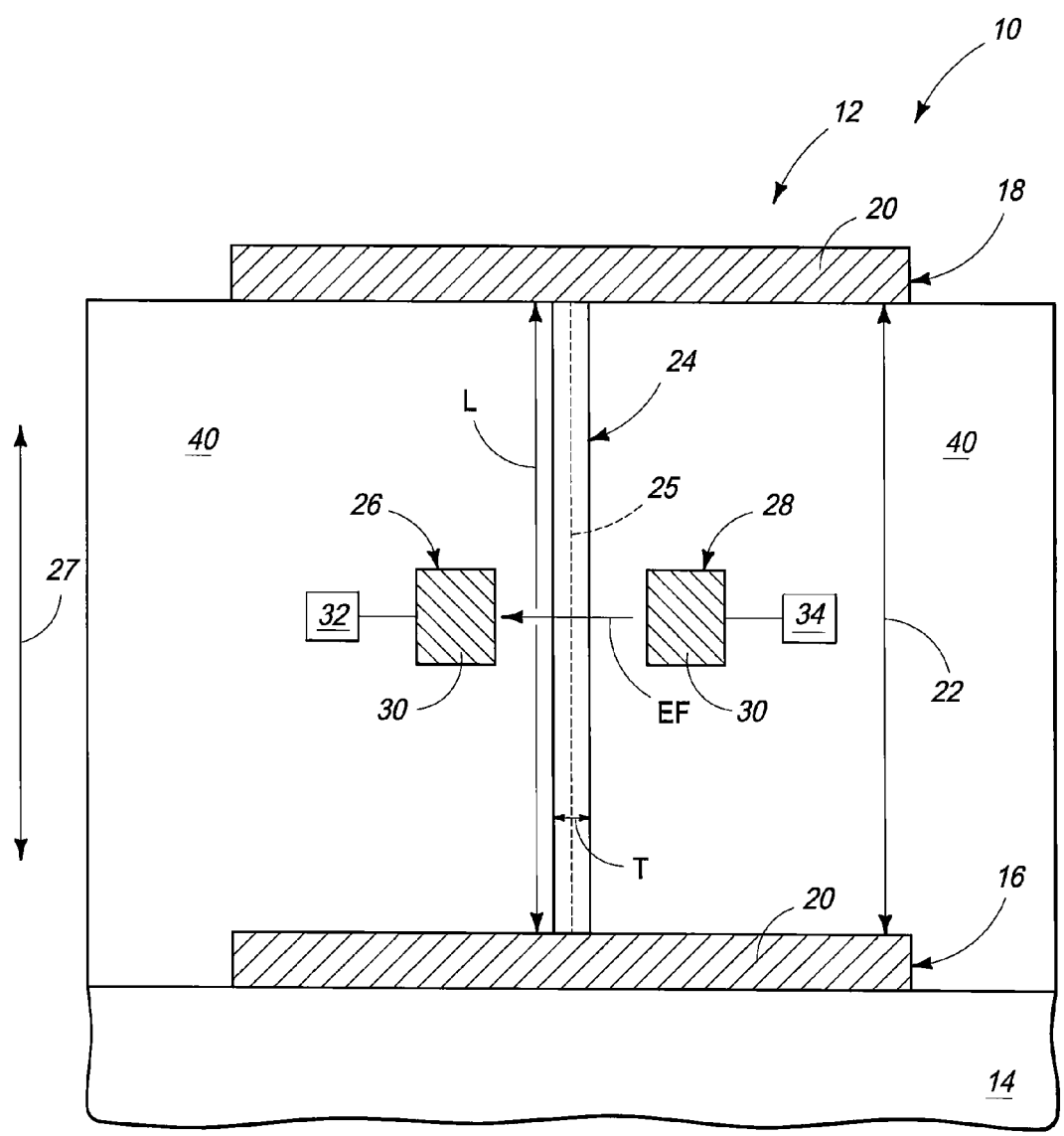
FIG. 1 is a diagrammatic, cross-sectional side view of an example embodiment switch.

A portion of an integrated circuit construction 10 is illustrated in FIG. 1, showing an example embodiment graphene-containing switch 12 supported by a base 14. Although the base is shown to be homogeneous, such base may comprise numerous components and materials in various embodiments. For instance, the base may comprise a semiconductor substrate supporting various materials and components associated with integrated circuit fabrication. Example materials that may be associated with the substrate include one or more of refractory metal materials, barrier materials, diffusion materials, insulator materials, etc. The semiconductor substrate may, for example, comprise, consist essentially of or consist of monocrystalline silicon. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above.

The switch 12 includes a first electrode 16 and a second electrode 18. Such electrodes are spaced apart from one another, and specifically are separated from one another by a space 22 in the shown embodiment.

The electrodes 16 and 18 comprise electrically conductive electrode material 20. Such electrode material may comprise any suitable electrically conductive composition, or combination of compositions; and may, for example, comprise one or more of various metals (for instance, tungsten, titanium, copper, etc.), metal-containing materials (for instance, metal silicide, metal carbide, metal nitride, etc.), and conductively-doped semiconductor materials (for instance, conductively-doped silicon, conductively-doped germanium, etc.). Although both of the electrodes 16 and 18 are shown comprising the same electrically conductive material, in other embodiments the electrodes 16 and 18 may comprise different conductive materials relative to one another.

A graphene structure 24 extends between the electrodes. The graphene structure may be referred to as extending longitudinally between the electrodes; with the term "longitudinally" being used to designate an orientation of the graphene structure to which other components may be compared. For instance, the electrodes 16 and 18 may be considered to be spaced from one another along the longitudinal dimension of the graphene structure; and the graphene structure may be considered to have a thickness, "T", along a lateral dimension which extends orthogonally to the longitudinal dimension. The "longitudinal" dimension of the graphene structure may be any part of the graphene structure designated as such; and may or may not be the longest dimension of the graphene structure.

In the shown embodiment, the graphene structure extends across the space 22, and directly contacts both of the electrodes 16 and 18. In some embodiments, the graphene structure will comprise more than one layer of graphene. For instance, the graphene structure may be a multi-layer (e.g., bilayer) structure. A dashed-line 25 is shown within the structure 24 to diagrammatically illustrate that such structure may comprise more than one layer of graphene in some embodiments. The layers may be the same thickness, or may be different thicknesses relative to one another.

In operation, current flows along the graphene structure 24 between the electrodes 16 and 18 when the switch 12 is in an "on" state. Such current flow may be considered to be along the direction of an axis 27.

The switch 12 comprises a pair of nodes 26 and 28, with such nodes being laterally outward of the graphene structure and on opposing sides of the graphene structure 24 in the shown embodiment. The nodes comprise electrically conductive material 30. Such electrically conductive material may comprise any suitable composition, including any of the compositions described above with reference to the electrodes 16 and 18. Although the nodes 26 and 28 are shown comprising a same composition as one another, in some embodiments the nodes may comprise different compositions relative to one another.

The nodes 26 and 28 are connected to circuitry 32 and 34, respectively, with such circuitry being configured to generate an electric field (EF) between the nodes. Such electric field is transverse to a direction of current flow along graphene structure 24. Although the electric field is illustrated as being oriented from electrode 28 toward electrode 26, the electric field may be oriented in an opposite direction in other embodiments. The field EF may be comprised by an electric field that is primarily orthogonal to the graphene structure (as shown), or may be comprised by an electric field that is primarily at an angle other than orthogonal to the graphene structure. If an electric field is primarily at an angle other than parallel to the direction of current flow along the graphene structure (i.e., a direction other than along axis 27), such electric field will have a vector component that corresponds to the illustrated field EF which is transverse to the direction of current flow along graphene structure 24. Thus, the generation of an electric field that is directed primarily along any direction other than parallel to the axis 27 may be considered to comprise generation of an electric field transverse to the direction of current flow along graphene structure 24. It is noted that an electric field component along axis 27 (i.e., parallel to a direction of current flow along graphene structure 24) may be useful to assist in moving electrons from electrode 16 to 18, or vice versa, in the "on" state of the switch.

The nodes 26 and 28 may be considered together as an electrical component configured to alter a bandgap within graphene of the graphene structure 24. Specifically, the electric field generated between the nodes may alter the bandgap within graphene of the graphene structure 24 by taking advantage of a relationship described by Feng Wang (see, for example, Zhang, et. al., Nature 459, 820-823 (11 Jun. 2009)), whereupon a bandgap within the graphene is increased by increasing the electric field between the nodes 26 and 28.

Manipulation of the magnitude of the electric field transverse to current flow within the graphene structure 24 may be used to control the state of the switch. A relatively high transverse electric field may be utilized to maintain the switch 12 in an "off" state, while a relatively low transverse electric field may be utilized to maintain the switch 12 in an "on" state. The terms "relatively high transverse electric field" and "relatively low transverse electric field" are utilized to indicate that the transverse electric fields are low and high relative to one another. In some embodiments, the total voltage differential between the nodes 26 and 28 may be changed by about 0.25 eV to transition the switch from the "on" state to the "off" state, or vice versa. In some embodiments, the transition from the "on" state to the "off" state may be achieved by providing a transverse electric field of less or equal to about 3 volts/nanometer, and in some embodiments may be achieved by providing a transverse electric field of less or equal to about 2 volts/nanometer.

The graphene structure 24 has a length "L" from electrode 16 to electrode 18, and the thickness "T" along a direction orthogonal to the length. The length and thickness of the graphene structure may be tailored to achieve desired performance characteristics; and additionally the spacing between nodes 26 and 28, and the direction of the electric field generated between such nodes, may be tailored to achieve desired performance characteristics.

In some embodiments, the graphene structure 24 will have a maximum overall thickness between the nodes 26 and 28 of less than about 5 nanometers. In some embodiments, the graphene structure will comprise two or more layers, and at least one of the layers will have a maximum thickness between the nodes of less than about 5 nanometers; and in some embodiments all of such layers will have a maximum thickness between the nodes of less about 5 nanometers. In some embodiments, the individual layers of graphene will have thicknesses within a range of from at least about 1 nanometer to at least about 5 nanometers.

In some embodiments, the graphene structure 24 will have a length "L" within a range of from at least about 10 nanometers to at least about 50 nanometers.

Figure 2:
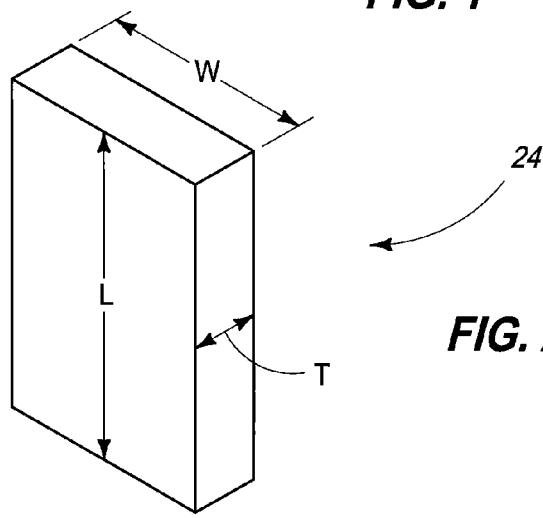
FIG. 2 is a diagrammatic, three-dimensional view of an example embodiment graphene structure that may be utilized in the switch of FIG. 1.
Figure 3:
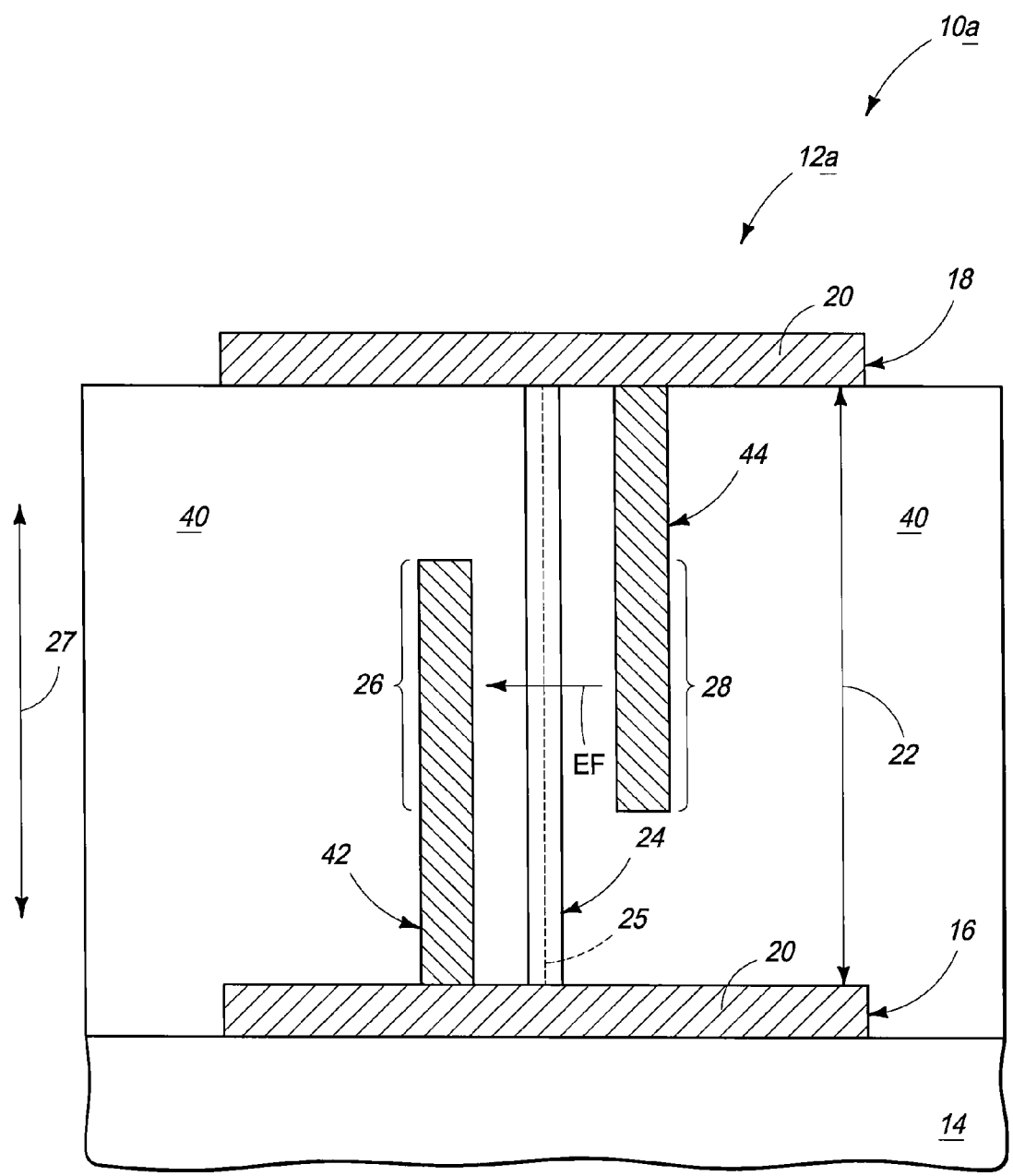
FIG. 3 is a diagrammatic, cross-sectional side view of another example embodiment switch.

In some embodiments, the graphene structure 24 may be rectangular-shaped. An example rectangular-shaped graphene structure is shown in FIG. 2. Such structure has the length "L" and the thickness "T" discussed above, and in addition has a width "W". The width may be tailored, in addition to the thickness and length, to achieve desired bandgap characteristics in the graphene, and desired performance characteristics of the switch 12 (FIG. 1). In some embodiments, the graphene structure 24 will have a width "W" of from at least about 5 nanometers to at least about 20 nanometers.

In some embodiments, the graphene structure may be thin enough to have an inherent bandgap; and may, for example, be a strip having a narrow dimension (for instance, a dimension of less than or equal to about 20 nanometers, less than about 10 nanometers, or even less than or equal to about 5 nanometers). A relationship between graphene strip dimensions and bandgap is described in several articles by H. Dai (for instance, Li et. al., Science 319, 1229-1232 (2008)).

The graphene structure 24 may be configured relative to the electric field "EF" of the switch 12 of FIG. 1 so that the electric field extends primarily along the thickness "T" of the graphene structure (as shown in FIG. 1), or may be rotated relative to the configuration of FIG. 1 so that the electric field extends primarily along the width "W" of the graphene structure, or may be rotated so that the electric field extends through the graphene structure along a primary direction which is angled relative to both the thickness and the width of the graphene structure.

In some embodiments, the graphene structure 24 may comprise two or more graphene layers which are dimensionally configured to take advantage of the relationship described by H. Dai so that the graphene has an inherent bandgap in the absence of a transverse electric field. Such can provide an additional parameter to tailor the conductivity of the "on" state mode of switch 12 for particular applications. In other embodiments, the graphene structure 24 may comprise one or more layers which all individually have dimensions too large for a significant bandgap to be within the graphene of the structure 24 in the absence of an applied transverse electric field. Such can enable the graphene structure to have very high conductance in the "on" state mode of the switch.

A dielectric material 40 is shown within the space between the electrodes 16 and 18, and surrounding the nodes 26 and 28. The dielectric material may comprise any suitable composition or combination of compositions, and in some embodiments may comprise one or more of silicon dioxide, silicon nitride, and any of various doped silicate glasses (for instance, borophosphosilicate glass, phosphosilicate glass, fluorosilicate glass, etc.). Although the dielectric material 40 is shown to be homogeneous throughout the switch 12, in other embodiments multiple different dielectric materials may be utilized.

The nodes 26 and 28 may be connected to any suitable circuitry to enable the transverse electric field to be generated across the graphene structure 24. In some embodiments, each of the nodes may be conductively coupled to one of the electrodes 16 and 18. An example of such embodiments is described with reference to a construction 10a shown in FIG.

3. Such construction comprises a switch 12a analogous to the switch 12 described above with reference to FIG. 1.

The switch 12a comprises an upwardly-extending electrically conductive structure 42 electrically coupled with the bottom electrode 16, and comprises a downwardly-extending structure 44 electrically coupled with the top electrode 18. The nodes 26 and 28 are effectively comprised by portions of the structures 42 and 44 that vertically overlap one another in the illustrated configuration.

The structures 42 and 44 may comprise any suitable electrically conductive materials, and may comprise the same material as one another or different materials relative to one another. Also, the structures 42 and 44 may comprise common materials as the electrodes 16 and 18, or one or both of the structures 42 and 44 may comprise different materials relative to one or both of the electrodes 16 and 18.

Figure 6:
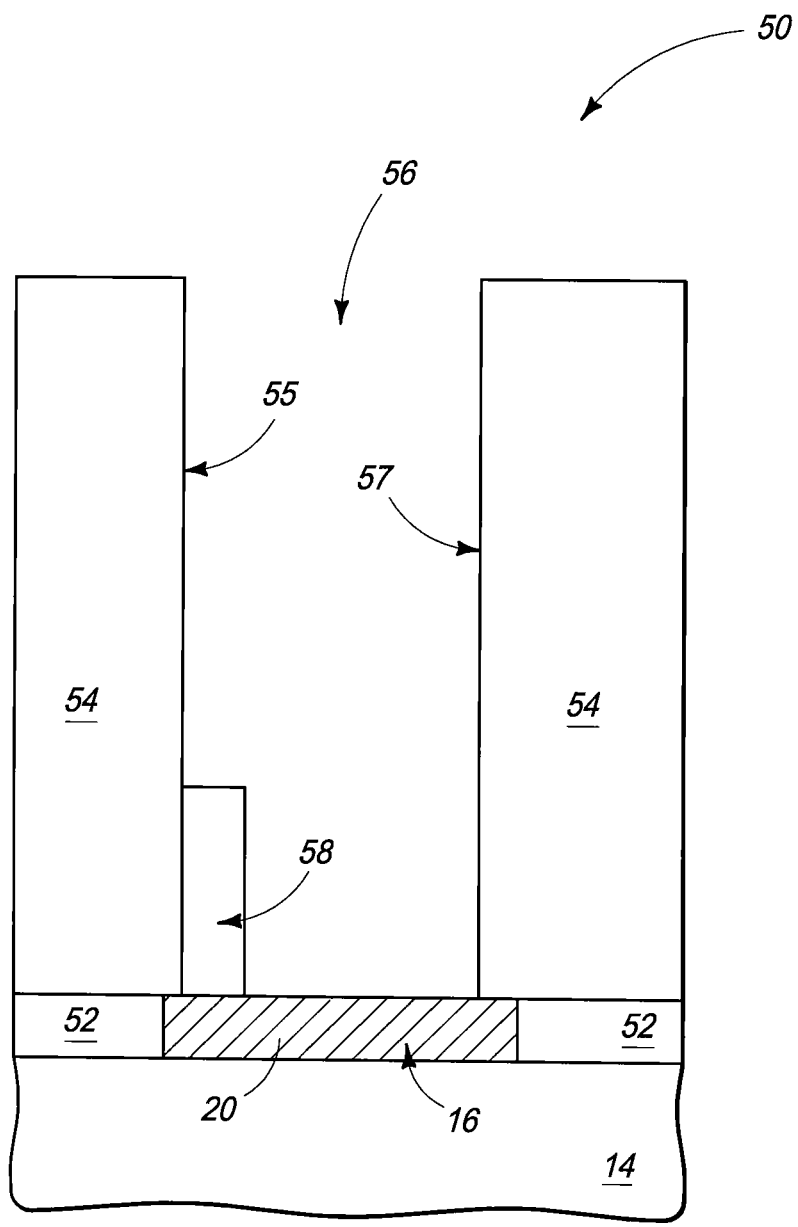

In some embodiments, it may be advantageous to tightly pack a plurality of switches over a semiconductor substrate. FIG. 6 shows a construction 45 having a pair of switches 12a (of the type described above with reference to FIG. 2) packed next to one another. In the shown embodiment, the switches are mirror images of one another along a vertical plane 31. In some embodiments, such configuration may enable two adjacent switches to be formed in a common trench.

Some embodiments include methods of forming switches of the various types described above with reference to FIGS. 1-4. FIGS. 5-11 illustrate process stages of a first embodiment method which may be utilized to fabricate switch-containing constructions analogous to the construction described above with reference to FIG. 3, and FIGS. 12-15 illustrate process stages of a second embodiment method which may be utilized to fabricate constructions analogous to the multi-switch construction described above with reference to FIG. 4.

Figure 4:
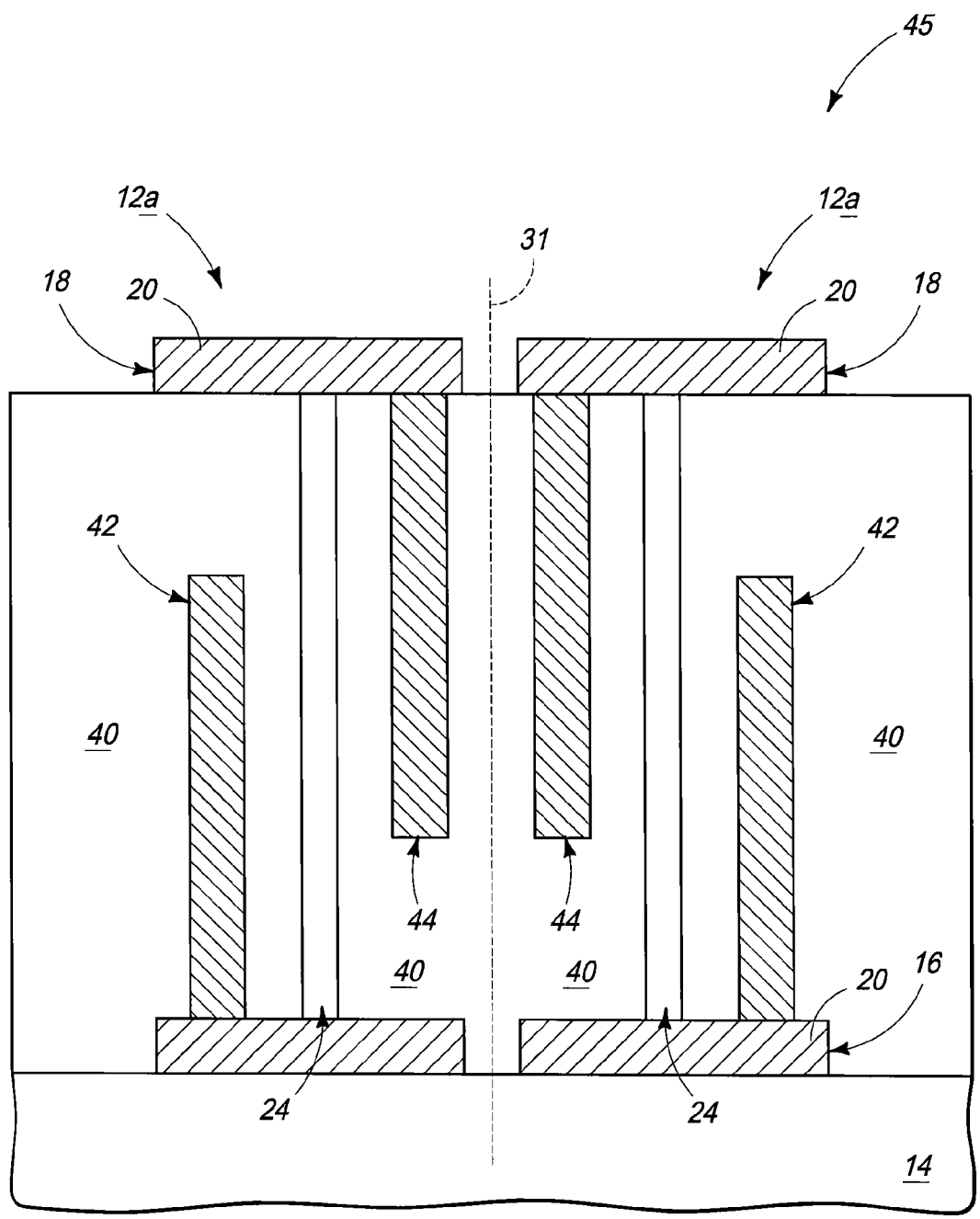
FIG. 4 is a diagrammatic, cross-sectional view of a construction comprising a pair of example embodiment switches.
Figure 5:
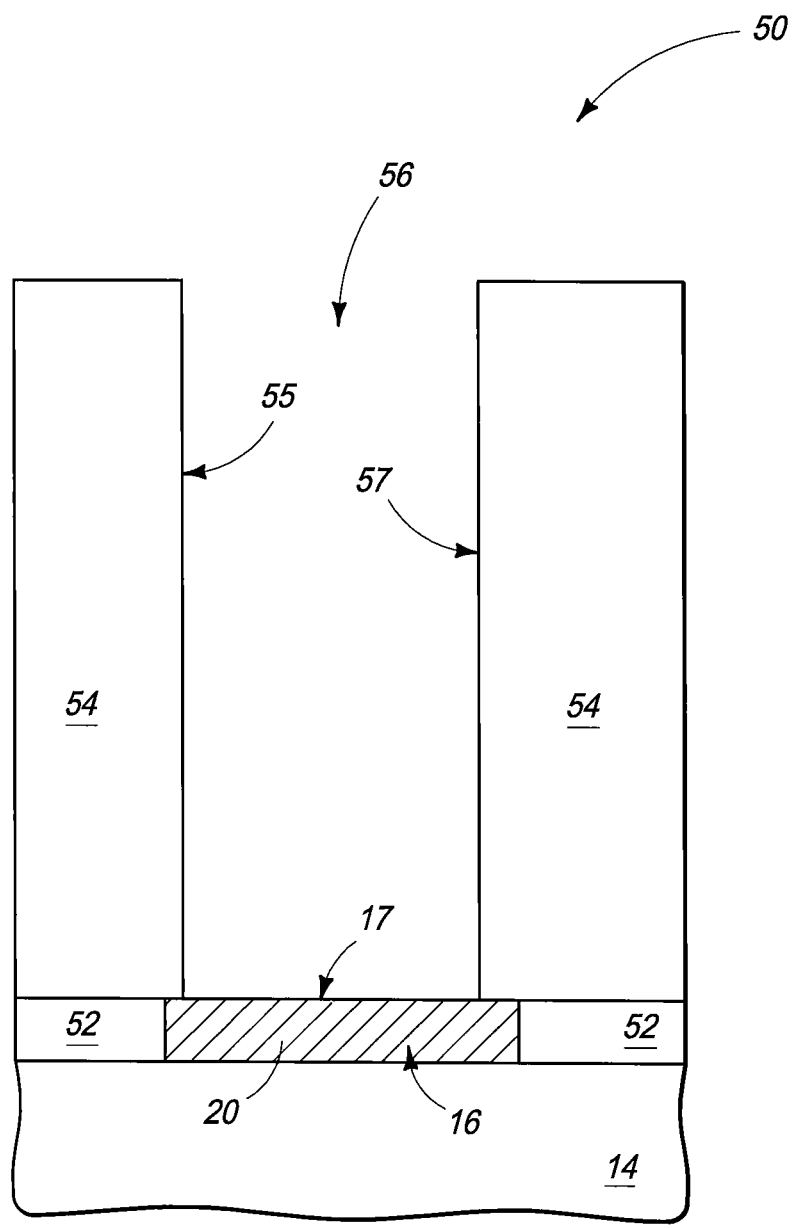
FIGS. 5-11 are diagrammatic, cross-sectional views of a portion of a construction at various stages of an example embodiment method for fabricating a graphene-containing switch.

Referring to FIG. 5, a construction 50 is shown to comprise a base 14 and a bottom electrode 16 supported over such base. The base 14 may comprise any of the configurations discussed above with reference to FIGS. 1-4. The electrode 16 may comprise any suitable material, and is shown to comprise a material 20 of the type described above with reference to FIG. 1. In the shown embodiment, the bottom electrode is laterally surrounded by a dielectric material 52. The dielectric material 52 may comprise any suitable electrically insulative composition or combination of compositions; and in some embodiments may comprise, consist essentially of, or consist of one or more of silicon dioxide, silicon nitride and any of various doped silicate glasses.

A dielectric material 54 is formed across the bottom electrode 16 and the dielectric material 52, and an opening 56 is patterned within material 54 to expose an upper surface 17 of the bottom electrode. The opening 56 may be formed utilizing any suitable processing. For instance, in some embodiments material 54 may be initially formed to cover an entirety of the upper surface of electrode 16, and subsequently opening 56 may be formed by etching through material 54 while utilizing a photolithographically-patterned photoresist mask (not shown) to define a location of the opening. The mask may then be removed with subsequent processing.

The opening 56 has a pair of sidewalls 55 and 57 when viewed along the cross-section of FIG. 5. Such sidewalls may merge in a location outside of the plane of the FIG. 5 view so that the apparent pair of sidewalls is actually a single sidewall that extends around opening 56.

Referring to FIG. 6, a dielectric spacer 58 is formed along a bottom region of the sidewall 55. The dielectric spacer may be formed utilizing any suitable processing. For instance, a layer of dielectric material may be formed conformally over material 54 and within opening 56, and such layer may be patterned utilizing one or more photolithographically-patterned masks (not shown) and suitable etching to create the spacer 58. The spacer 58 may comprise any suitable dielectric composition or combination of compositions; and in some embodiments may comprise, consist essentially of, or consist of one or more of silicon dioxide, silicon nitride, and any of various doped silicate glasses.

Figure 7:
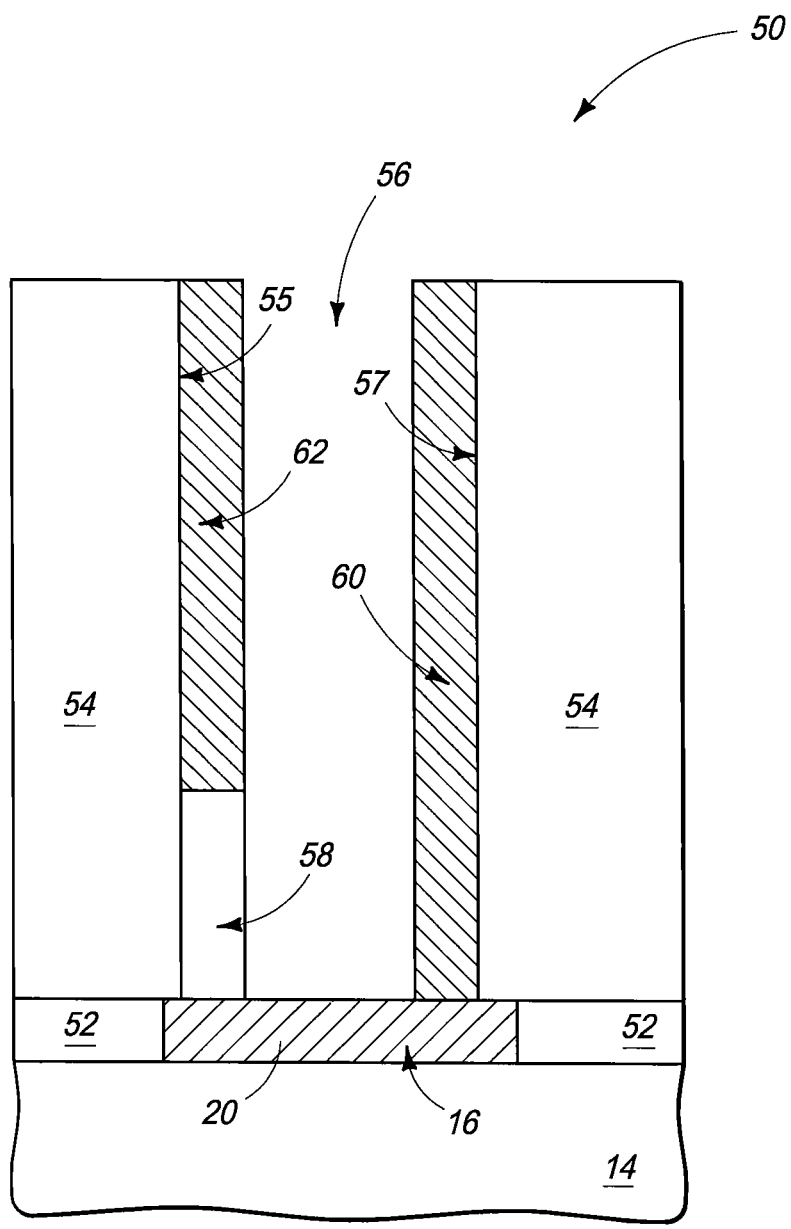

Referring to FIG. 7, electrically conductive liners 60 and 62 are formed along the sidewalls 55 and 57. The liners 60 and 62 may comprise any suitable electrically conductive composition or combination of compositions; and in some embodiments may comprise, consist essentially of, or consist of one or more of various metals, metal-containing compositions, and conductively-doped semiconductor materials.

The liners 60 and 62 may be formed with any suitable processing. For instance, a layer of electrically conductive material may be formed over dielectric 54 and within opening 56, and then subjected to an anisotropic etch to form the illustrated liners. In some embodiments, chemical-mechanical polishing (CMP) may be utilized after the anisotropic etch to form the illustrated planarized upper surface extending across the material 54 and the liners 60 and 62.

Figure 8:
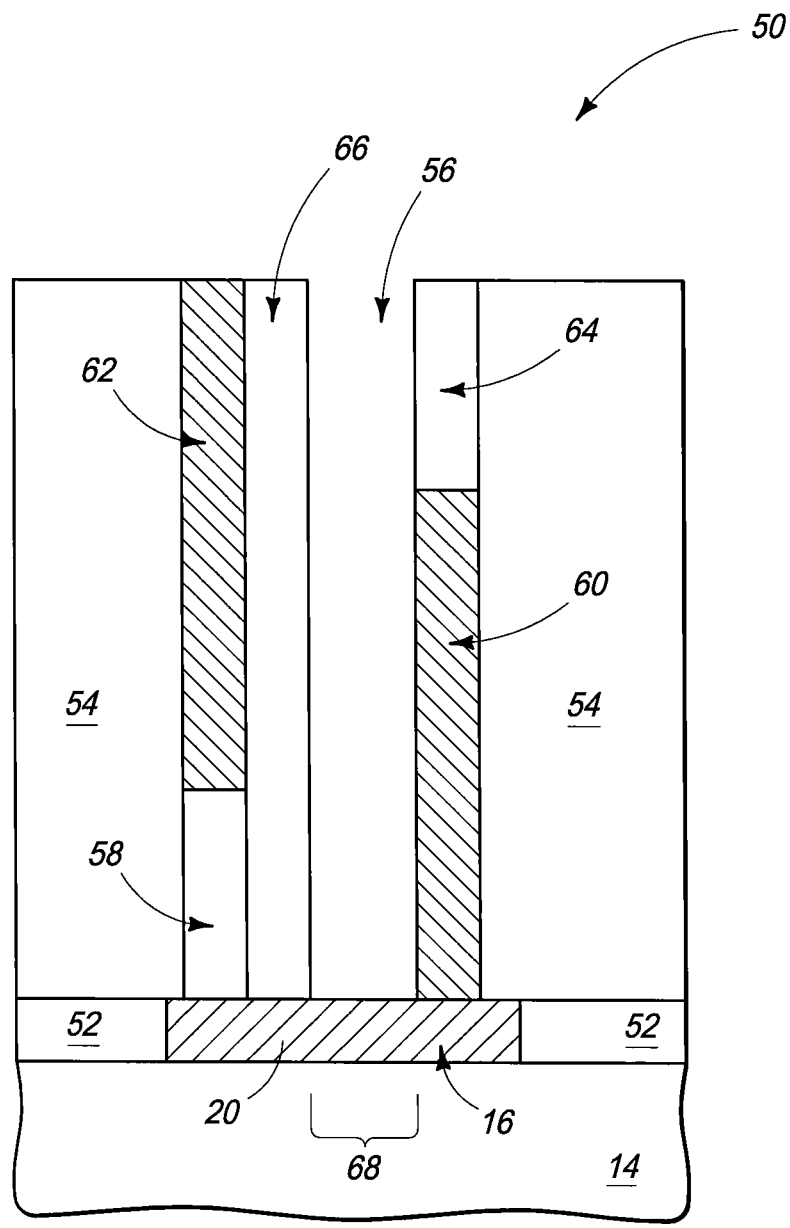

Referring to FIG. 8, a top portion of liner 60 is replaced with a dielectric spacer 64. Such replacement may be accomplished utilizing any suitable processing. For instance, a patterned mask (not shown) may be formed to protect liner 62 while exposing liner 60 to an anisotropic etch which removes the top portion of liner 62. Subsequently, dielectric material may be formed over the remainder of liner 60 and patterned to form the shown dielectric spacer 64. In some embodiments, dielectric spacers 58 and 64 may be referred to as first and second dielectric spacers, respectively.

The liners 60 and 62 may be referred to as first and second electrically conductive structures, respectively; and such structures are directly over the bottom electrode. In the shown embodiment, the first electrically conductive structure 60 directly contacts the bottom electrode 16, and the second electrically conductive structure 62 does not directly contact the bottom electrode. Instead, the second electrically conductive structure is spaced from the bottom electrode by dielectric spacer 58.

A dielectric liner 66 is formed along a sidewall of electrically conductive structure 62. The dielectric liner may be formed utilizing any suitable processing. For instance, the dielectric liner may be formed by providing dielectric material across an entirety of construction 50, and then subsequently patterning such material utilizing a patterned mask (not shown) and one or more suitable etches. Subsequently, CMP may be utilized to form the illustrated planarized upper surface extending across material 54, liner 62, spacer 64 and liner 66.

The liner 66 may comprise any suitable electrically insulative composition or combination of compositions; and in some embodiments may comprise, consist essentially of, or consist of one or more of silicon dioxide, silicon nitride and any of various doped silicate glasses.

Although the liner 66 is shown formed against conductive structure 62, in other embodiments the liner may be formed against the other conductive structure 60.

After liner 66 is formed, the opening 56 is narrowed by the various structures 58, 60, 62, 64 and 66. The bottom electrode 16 has a portion 68 exposed within the narrowed opening, and has another portion covered by the various structures 58, 60, 62, 64 and 66.

Figure 9:
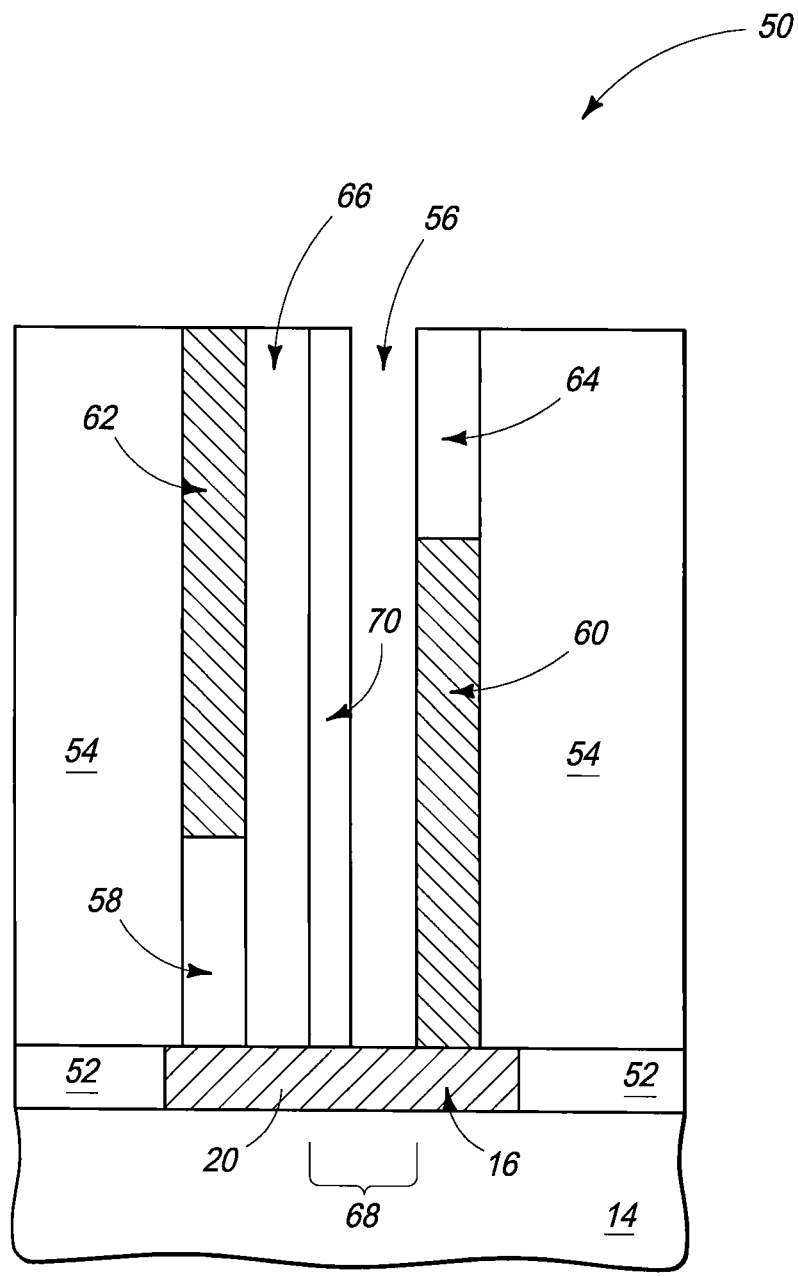

Referring to FIG. 9, a graphene structure 70 is formed along a sidewall of dielectric liner 66. The graphene structure directly contacts the exposed portion 68 of bottom electrode 16, and thus is directly electrically coupled with the bottom electrode in the shown embodiment. The graphene structure 70 is analogous to the structure 24 discussed above with reference to FIG. 3, and may comprise any suitable composition. For instance, the graphene structure may comprise a single graphene layer in some embodiments; and may comprise multiple graphene layers in other embodiments (e.g., may be a bilayer structure in some embodiments).

The graphene structure 70 may be formed utilizing any suitable processing. For instance, a suitable seed material may be formed along dielectric spacer 66, and then graphene may be epitaxially grown from such a seed material. Example seed materials may include silicon carbide and/or various metals (for instance, ruthenium, iridium, etc.). Alternatively, a graphene precursor may be formed along dielectric spacer 66 and then converted to graphene. An example graphene precursor is graphite oxide, which may be converted to graphene utilizing one or more suitable reductants (for instance, hydrazine).

In the shown embodiment, the graphene structure 70 is formed only along a sidewall of dielectric liner 66. In some embodiments, such may be accomplished by providing appropriate seed material and/or precursor only along the sidewall of the dielectric liner. For instance, the seed material and/or precursor may be deposited over the top of the liner 66 as well as along the sidewall, and then subjected to anisotropic etching to leave the seed material and/or precursor only along the sidewall. Alternatively, in some embodiments the graphene structure may be initially formed to extend across an upper surface of the dielectric liner, and possibly even across an upper surface of the electrically conductive structure 62. The graphene structure may then be removed from over the upper surfaces utilizing CMP, anisotropic etching, and/or other appropriate processing to form the construction shown in FIG. 9.

Although the electrically conductive structures 60 and 62 are described as being simultaneously formed at the processing stage of FIG. 7, in other embodiments the conductive structures may be sequentially formed. For instance, structure 62 may be formed at the processing stage of FIG. 7 and structure 60 may be formed at a processing stage subsequent to formation of one or both of the dielectric liner 66 and the graphene structure 70.

After formation of graphene structure 70, a portion of opening 56 remains along the electrically conductive structure 60 and dielectric spacer 64 (specifically, such opening is on an opposing side of graphene structure 70 from the dielectric liner 66). The opening is subsequently filled with dielectric material 72, as shown in FIG. 10.

Figure 10:
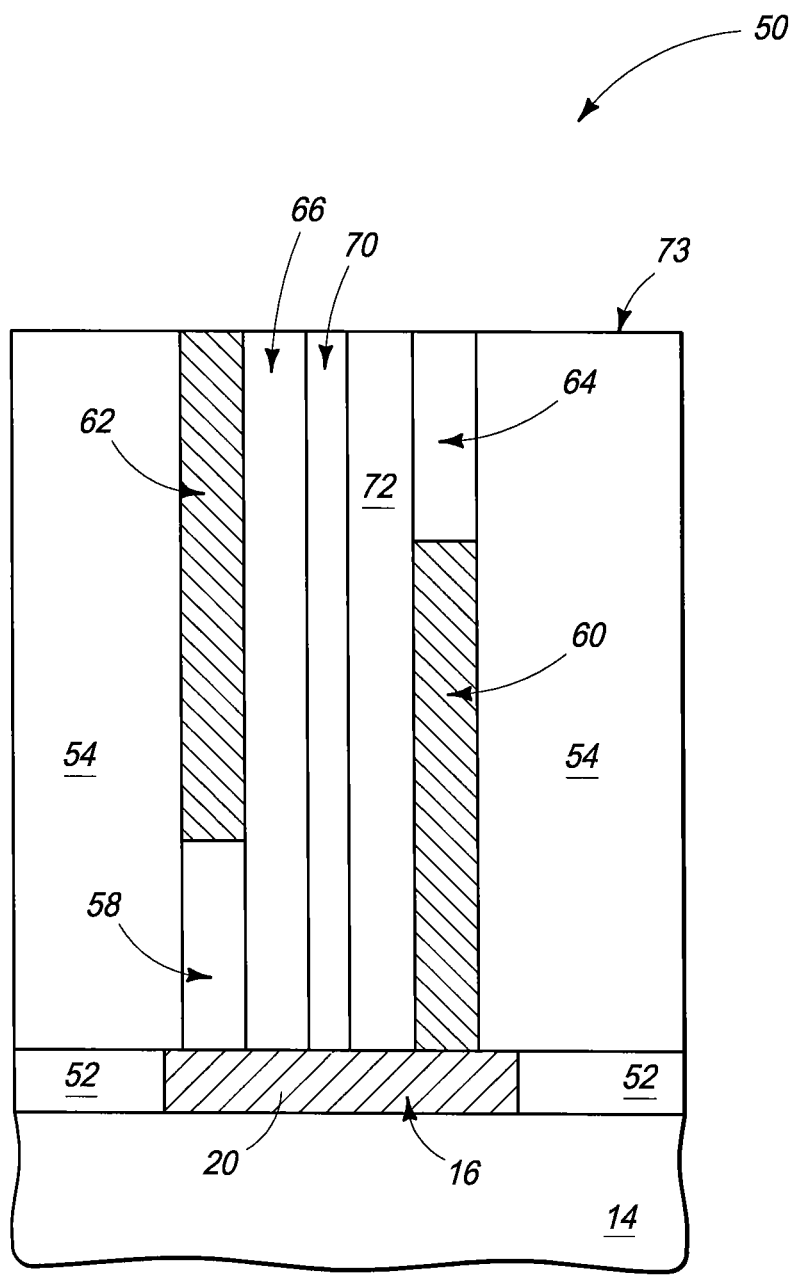

A planarized upper surface 73 extends across construction 50 at the processing stage of FIG. 10. Such planarized upper surface may be formed with any suitable processing, such as, for example, CMP. Planarized upper surfaces of construction 50 are illustrated at all of the various process stages of FIGS. 6-10 in the illustrated example embodiment. In other embodiments, various of the materials provided at the process stages of FIGS. 6-10 may be left with non-planarized upper surfaces, and then planarization may be conducted after formation of the final material utilized to fill opening 56 (material 72 in the shown example embodiment) to form the planarized upper surface 73 of FIG. 10.

Figure 11:
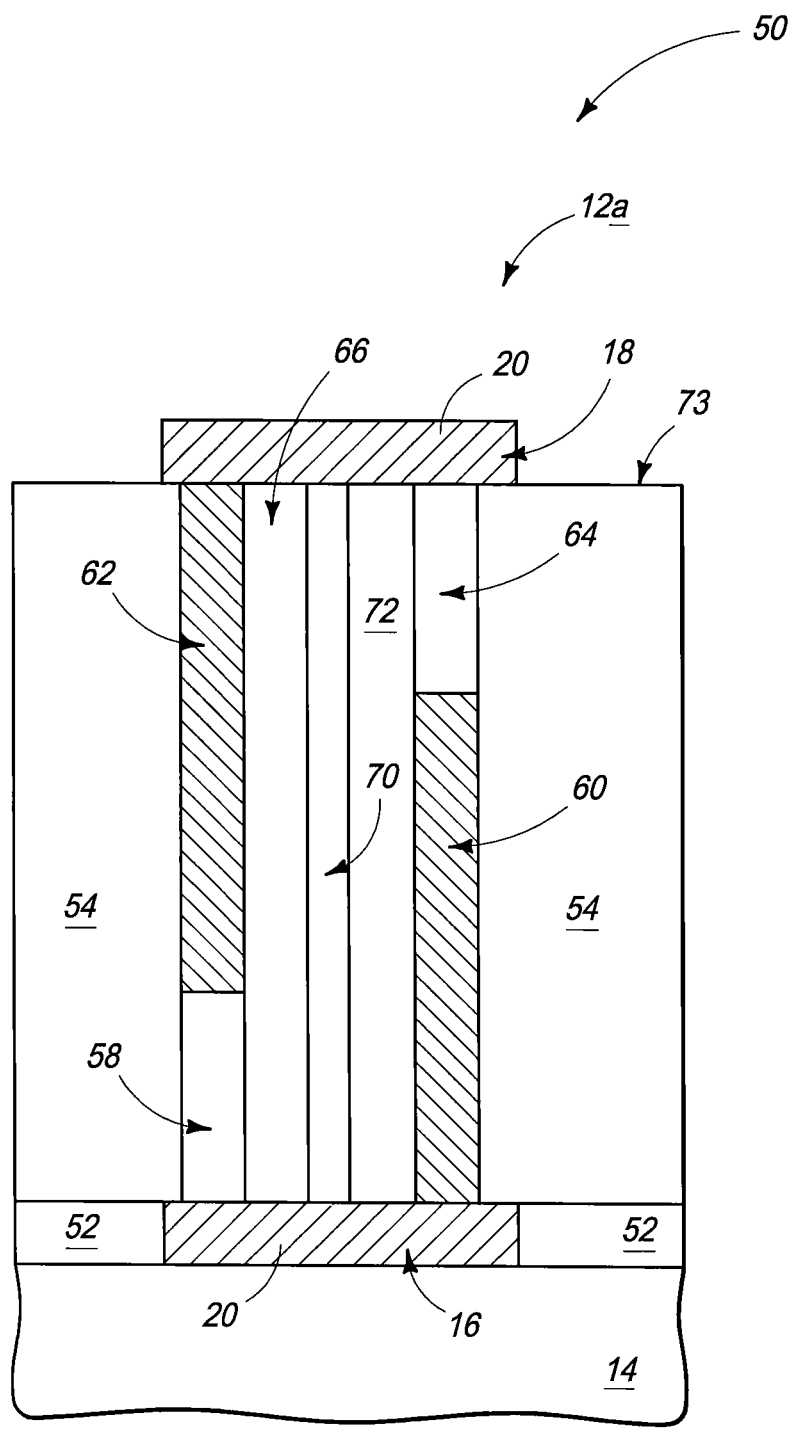

Referring to FIG. 11, the top electrode 18 is formed on the planarized upper surface 73. The top electrode 18 is shown comprising electrically conductive material 20. The top electrode may be formed utilizing any suitable processing. For instance, material 20 may be formed across an entirety of upper surface 73 and then patterned utilizing a photolithographically-patterned photoresist mask (not shown) and one or more suitable etches to form the patterned top electrode 18 of FIG. 11.

The top electrode 18 is electrically coupled with the downwardly-extending electrically conductive structure 62, and the bottom electrode 16 is electrically coupled with the upwardly-extending electrically conductive structure 60. Accordingly, the construction of FIG. 11 comprises a switch 12a analogous to the switch of FIG. 3, with the structures 60 and 62 being analogous to the structures 42 and 44 of FIG. 3. In operation, the structures 60 and 62 provide an electric field across the graphene structure 70 so that the switch of FIG. 11 may be operated analogously to the switch described above with reference to FIG. 3.

The integrated switch 12a may be utilized in any suitable application. In an example application, the switch may be representative of a plurality of substantially identical switches that are simultaneously fabricated across a semiconductor construction for utilization as select devices in a memory array.

FIGS. 12-15 illustrate another example process for fabricating graphene-containing switches.

Figure 12:
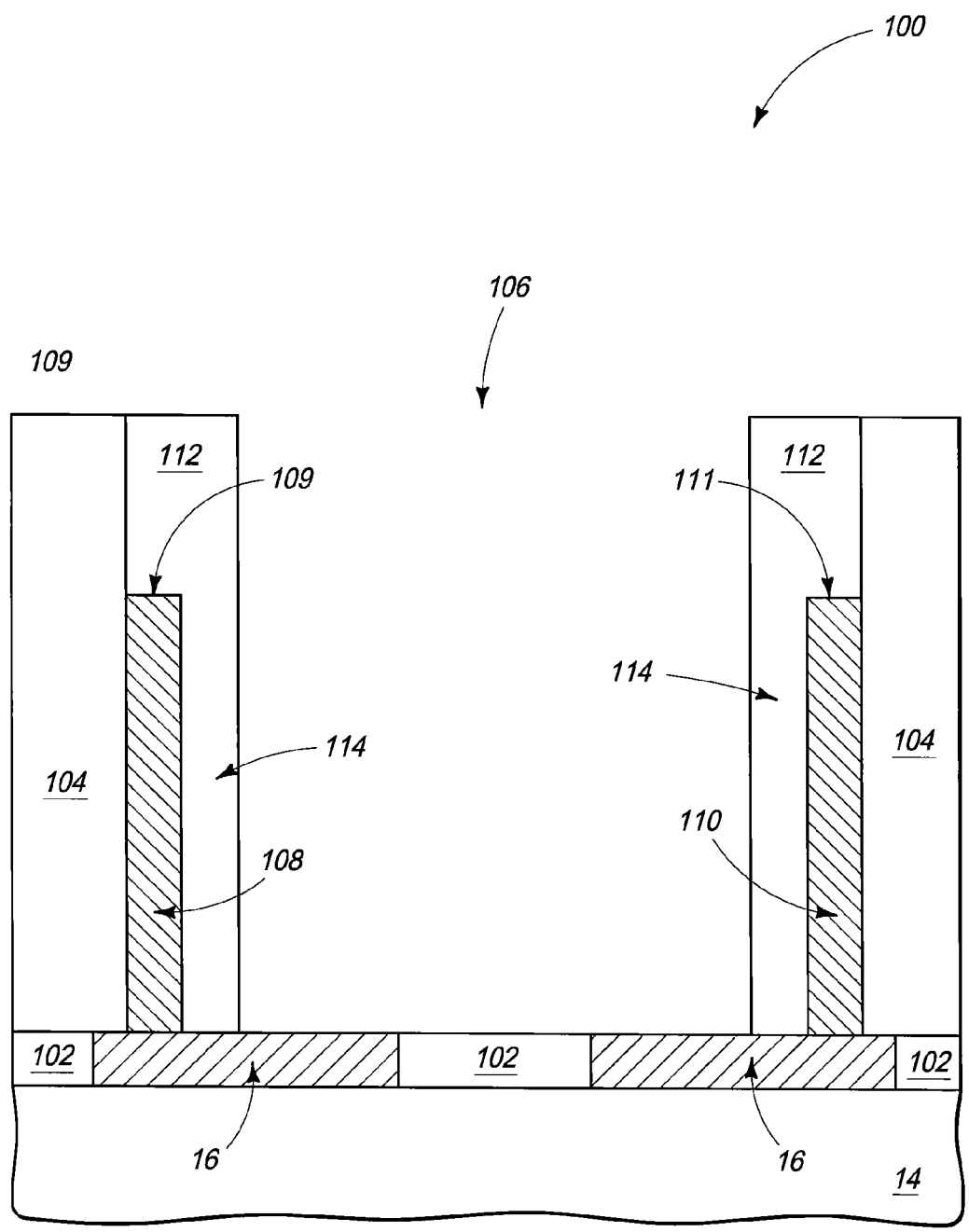
FIGS. 12-15 are diagrammatic, cross-sectional views of a portion of a construction at various stages of an example embodiment method for fabricating a plurality of graphene-containing switches within a single opening.

Referring to FIG. 12, a construction 100 comprises a base 14 and a pair of spaced apart bottom electrodes 16 supported over such base. The base 14 and electrodes 16 may comprise any of the configurations and compositions discussed above with reference to FIGS. 1-4.

The bottom electrodes are shown to be patterned within a dielectric material 102. The dielectric material 102 may comprise any suitable electrically insulative composition or combination of compositions; and in some embodiments may comprise, consist essentially of, or consist of one or more of silicon dioxide, silicon nitride and any of various doped silicate glasses.

A dielectric material 104 is formed across the bottom electrodes 16 and the dielectric material 102, and an opening 106 is patterned within material 104 to expose upper surfaces of the bottom electrodes. The opening 106 may be formed utilizing any suitable processing; including, for example, processing analogous to that described above with reference to FIG. 5 for forming the opening within material 56.

Upwardly-extending electrically conductive structures 108 and 110 are formed along sidewalls of opening 106, and directly against upper surfaces of the electrodes 16. The electrically conductive structures 108 and 110 may be formed with processing analogous to that described above with reference to FIG. 7 for fabrication of the structures 60 and 62.

The electrically conductive material of the structures 108 and 110 has been recessed relative to the top of material 104. Accordingly, uppermost surfaces 109 and 111 of the upwardly-extending structures 108 and 110 are below the top of opening 106 (i.e., are below the top surface of dielectric material 104).

A dielectric material 112 is patterned into liners 114 that extend along sidewalls of conductive structures 108 and 110, and over the top surfaces of the conductive structures. The liners 114 may be formed utilizing any suitable processing. For instance, material 112 may be formed over material 104, along the sidewalls of structures 108 and 110, and across a bottom surface of opening 106; and may then be subjected to anisotropic etching either alone, or in combination with the utilization of a patterned mask (not shown) to pattern material 112 into the liners 114.

In the shown embodiment, the dielectric material 112 may be considered to form spacers over the structures 108 and 110 analogous to the spacer 64 of FIG. 8, and to also form liners along sidewalls of the conductive structures analogous to the liner 66 of FIG. 9.

In some embodiments, the dielectric materials 104 and 114 may be referred to as first and second dielectric materials, respectively.

Figure 13:
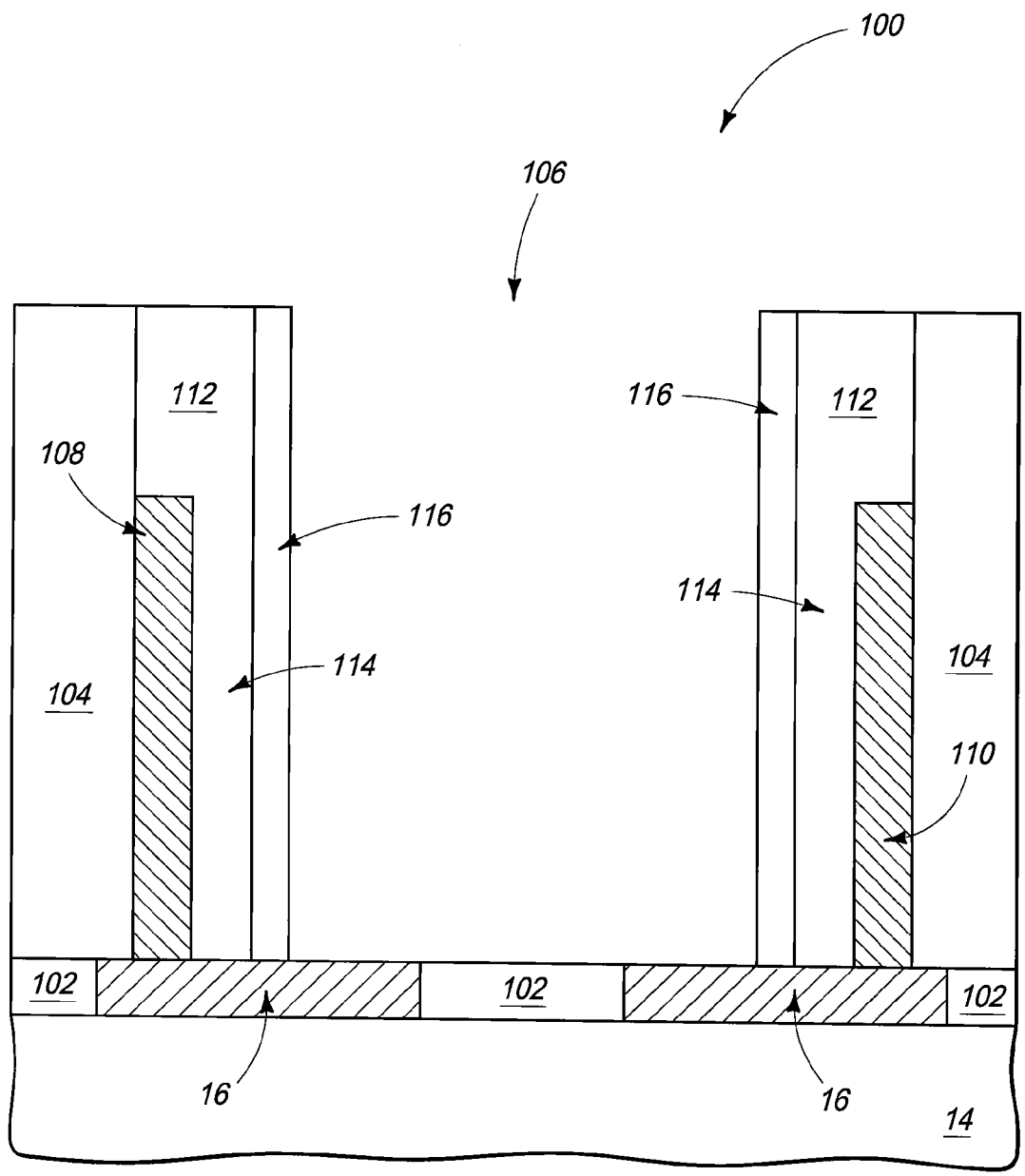

Referring to FIG. 13, graphene-containing structures 116 are formed along sidewalls of the liners 114. The graphene-containing structures may be formed with any suitable processing, including, for example, processing analogous to that described above with reference to FIG. 9 for fabrication of structure 70. Thus, the graphene-containing structures may be formed by, for example, epitaxial growth of graphene from suitable seed material and/or conversion of a suitable precursor into graphene. The graphene-containing structures may extend only along the sidewalls of liners 114 (as shown), or may extend across upper surfaces of one or both of materials 104 and 112 in other embodiments.

The graphene-containing structures 116 directly contact the bottom electrodes 16, and thus are electrically coupled with such bottom electrodes.

Figure 14:
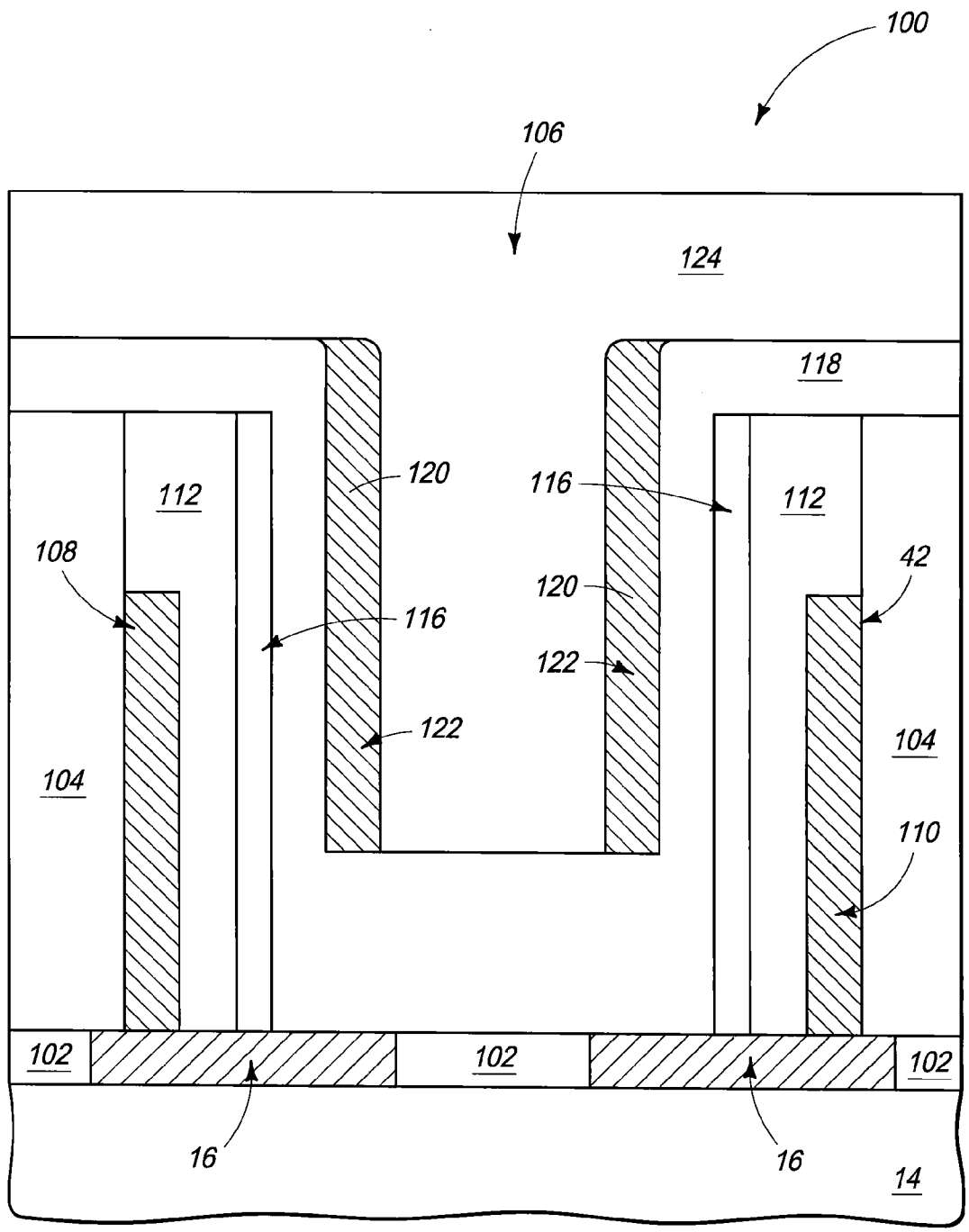

Referring to FIG. 14, dielectric material 118 is formed to extend over dielectric materials 104 and 112, along the sidewalls of graphene-containing structures 116, and across a bottom of opening 106. The dielectric material 118 may comprise any suitable composition or combination of compositions, and may, for example, comprise any of the compositions discussed above relative to the material 72 of FIG. 10. In some embodiments, the dielectric material 118 may be referred to as a third dielectric material to distinguish it from the first and second dielectric materials 104 and 112.

In the shown embodiment, regions of the bottom electrode 16 remained exposed after formation of graphene-containing structures 116 at the processing stage of FIG. 13, and the dielectric material 118 of FIG. 14 covers such exposed regions.

A conductive material 120 is patterned into electrically conductive structures 122 along lateral surfaces of dielectric material 118. The material 120 may be patterned into the shown electrically conductive structures with any suitable processing. For instance, material 120 may be formed conformally across dielectric material 118, and may then be subjected to anisotropic etching to pattern material 120 into the illustrated conductive structures 122. Ultimately, structures 122 will become downwardly-extending conductive structures analogous to the structures 44 of FIG. 4. The structures 122 are spaced from the bottom electrodes 16 by the dielectric material 118 in the shown embodiment. In other embodiments the structures 122 may be spaced from the bottom electrodes with dielectric spacers fabricated analogously to the spacer 58 of FIGS. 6-11.

A dielectric material 124 is formed across materials 118 and 120, and within a gap between the structures 122 to fill the opening 106. The dielectric material 124 may comprise any suitable composition or combination of compositions; and in some embodiments may comprise, consist essentially of, or consist of one or more of silicon dioxide, silicon nitride and any of various doped silicates. In some embodiments, the dielectric material 124 may be referred to as a fourth dielectric material.

Figure 15:
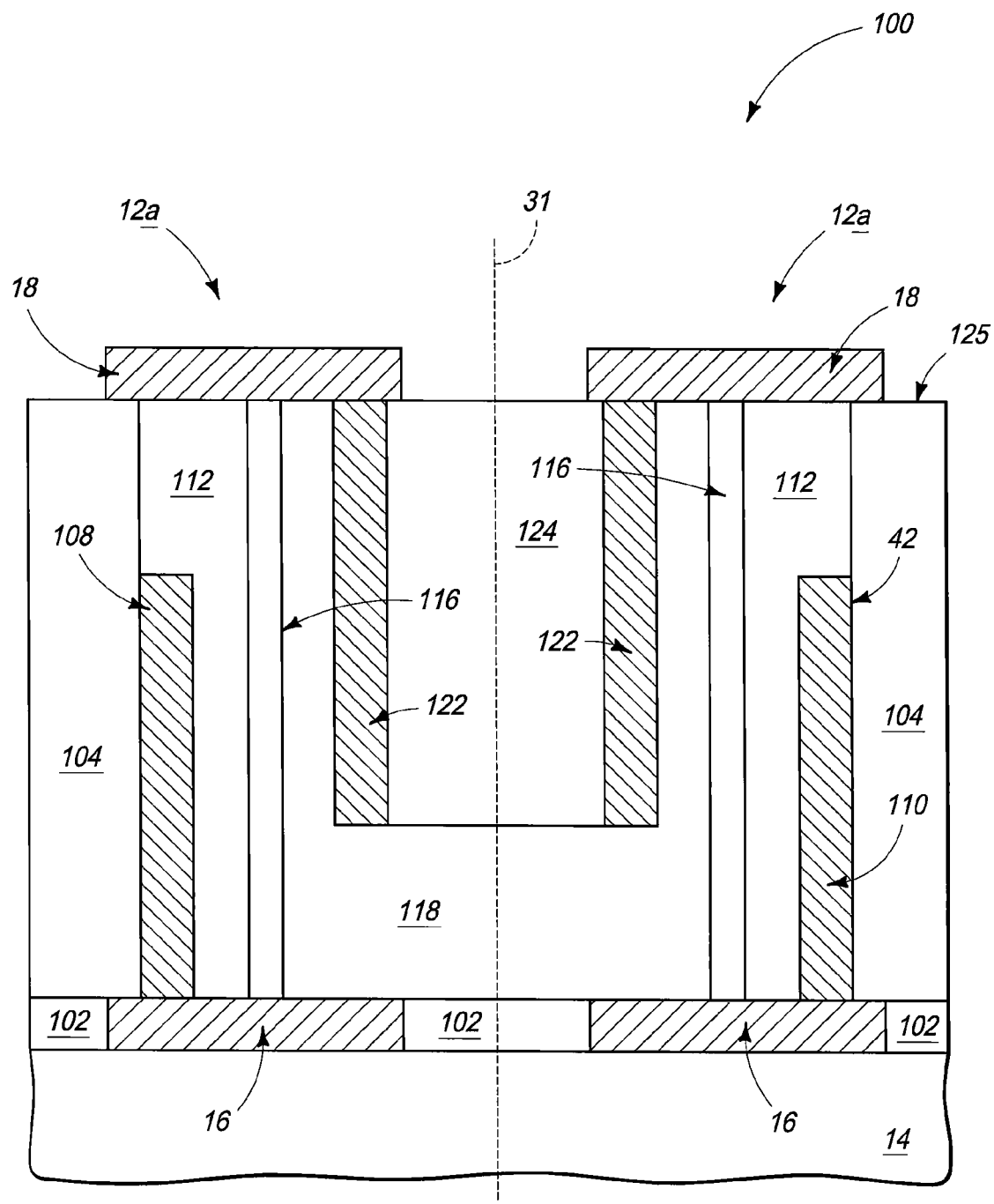

Referring to FIG. 15, construction 100 is subjected to planarization (for instance, CMP) to form a planarized upper surface 125 extending across the graphene structures 116 and the conductive structures 122. A pair of top electrodes 18 are formed on planarized upper surface 125. The top electrodes are directly against the graphene-containing structures 116 and the electrically conductive structures 122; and thus are electrically coupled with the graphene-containing structures 116 and the electrically conductive structures 122. The top electrodes are spaced from the conductive structures 108 and 110 by the dielectric material 112, and thus are not electrically coupled with the electrically conductive structures 108 and 110.

The construction of FIG. 15 is analogous to that of FIG. 4, and thus comprises a pair of switches 12a packed next to one another. In the shown embodiment, the switches are mirror images of one another along the vertical plane 31. The processing of FIGS. 12-15 forms a plurality of switches 12a within a single opening 106. Although the shown processing forms a pair of switches, analogous processing may be utilized to form more than two switches within a single opening.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, the invention includes a method of forming a switch. A bottom electrode is formed over a base. A first electrically conductive structure is formed directly over the bottom electrode. Dielectric material is formed along a sidewall of the first electrically conductive structure. The first electrically conductive structure and the dielectric material together cover a first portion of the bottom electrode while leaving a second portion of the bottom electrode exposed. A graphene structure is formed to be electrically coupled with the exposed portion of the bottom electrode, to be along the dielectric material, and to be laterally spaced from the first electrically conductive structure by the dielectric material. A second electrically conductive structure is formed on an opposing side of the graphene structure from the first electrically conductive structure, and is formed directly over the bottom electrode. A top electrode is formed over the graphene structure. The bottom electrode is electrically coupled with one of the first and second electrically conductive structures, and the top electrode is electrically coupled with the other of the first and second electrically conductive structures. The first and second electrically conductive structures are configured to provide an electric field across the graphene structure.

In some embodiments, the invention includes another method of forming a switch. First and second electrically conductive structures are formed over a bottom electrode and are formed to be laterally spaced from one another. The first electrically conductive structure directly contacts the bottom electrode, and the second electrically conductive structure does not directly contact the bottom electrode. A dielectric liner is formed along a sidewall of one of the first and second electrically conductive structures. A portion of the bottom electrode remains exposed after the formation of the dielectric liner. A graphene structure is formed to extend along the dielectric liner and to be electrically coupled with the bottom electrode. A top electrode is formed over the graphene structure and the first and second electrically conductive structures. The top electrode is electrically coupled with the graphene structure, directly contacts the second electrically conductive structure, and does not directly contact the first electrically conductive structure. The first and second electrically conductive structures are configured to provide an electric field across the graphene structure.

In some embodiments, the invention includes a method of forming a plurality of switches. A pair of spaced apart bottom electrodes are formed over a base, and a first dielectric material is formed over the bottom electrodes. An opening is formed to extend through the first dielectric material and to the bottom electrodes. A pair of upwardly-extending electrically conductive structures are formed along sidewalls of the opening. One of the upwardly-extending electrically conductive structures is directly against one of the bottom electrodes and the other of the upwardly-extending electrically conductive structures is directly against the other of the bottom electrodes. Second dielectric material is formed along sidewalls of the upwardly-extending electrically conductive structures. Portions of the bottom electrodes remain exposed after formation of the second dielectric material. A pair of graphene structures are formed to extend upwardly from the exposed portions of the bottom electrodes. A first of the graphene structures is electrically coupled with, and directly over, one of the bottom electrodes, and a second of the graphene structures is electrically coupled with, and directly over, the other of the bottom electrodes. Third dielectric material is formed along sidewalls of the graphene structures. A pair of downwardly-extending electrically conductive structures are formed along the third dielectric material. Fourth dielectric material is formed between the downwardly-extending electrically conductive structures. A pair of top electrodes are formed over the graphene structures and the downwardly-extending electrically conductive structures. One of the top electrodes is electrically coupled with the first graphene structure and with one of the downwardly-extending electrically conductive structures. The other of the top electrodes is electrically coupled with the second graphene structure and with the other of the downwardly-extending electrically conductive structures.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:
1. A method of forming a switch, comprising:
   forming a first electrically conductive structure over a bottom electrode;
   forming a graphene structure electrically coupled with the bottom electrode and laterally spaced from the first electrically conductive structure;
   forming a second electrically conductive structure over the bottom electrode and on an opposing side of the graphene structure from the first electrically conductive structure;
   forming a top electrode over the graphene structure; the bottom electrode being electrically coupled with one of the first and second electrically conductive structures, the top electrode being electrically coupled with the other of the first and second electrically conductive structures; and
   wherein the first and second electrically conductive structures impart an electric field across the graphene structure.

2. The method of claim 1 wherein the switch is formed in an opening over the bottom electrode, and wherein the switch is the only switch formed in the opening over the bottom electrode.

3. The method of claim 1 wherein the switch is one of a pair of switches that are formed in a common opening over a pair of bottom electrodes.

4. The method of claim 1 wherein the switch is one of a plurality of switches that are formed in a common opening over a plurality of bottom electrodes.

5. The method of claim 1 wherein the forming of the graphene structure comprises:
   forming seed material along the dielectric material; and
   epitaxially growing graphene along the seed material.

6. A method of forming a switch, comprising:
   forming first and second electrically conductive structures over a bottom electrode and laterally spaced from one another; the first electrically conductive structure directly contacting the bottom electrode, and the second electrically conductive structure not directly contacting the bottom electrode;
   electrically coupling a graphene structure with the bottom electrode;
   forming a top electrode over the graphene structure and the first and second electrically conductive structures; the top electrode being electrically coupled with the graphene structure, directly contacting the second electrically conductive structure, and not directly contacting the first electrically conductive structure; and
   wherein the first and second electrically conductive structures impart an electric field across the graphene structure.

7. The method of claim 6 wherein the first and second electrically conductive structures are formed simultaneously.

8. The method of claim 6 wherein the first and second electrically conductive structures are formed sequentially relative to one another.

9. A method of forming switches, comprising:
   forming a pair of spaced apart bottom electrodes over a semiconductor substrate;
   forming a first dielectric material over the bottom electrodes;
   forming an opening extending through the first dielectric material to the bottom electrodes;
   forming a pair of metal-containing upwardly-extending electrically conductive structures along sidewalls of the opening, one of the upwardly-extending electrically conductive structures being directly against one of the bottom electrodes and the other of the upwardly-extending electrically conductive structures being directly against the other of the bottom electrodes;
   forming second dielectric material along sidewalls of the upwardly-extending electrically conductive structures, portions of the bottom electrodes being exposed after formation of the second dielectric material;
   forming a pair of graphene structures extending upwardly from the exposed portions of the bottom electrodes; a first of the graphene structures being electrically coupled with, and directly over, one of the bottom electrodes; a second of the graphene structures being electrically coupled with, and directly over, the other of the bottom electrodes;

forming third dielectric material along sidewalls of the graphene structures;

forming a pair of metal-containing downwardly-extending electrically conductive structures along the third dielectric material;

forming fourth dielectric material between the downwardly-extending electrically conductive structures; and forming a pair of top electrodes over the graphene structures and the downwardly-extending electrically conductive structures; one of the top electrodes being electrically coupled with the first graphene structure and with one of the downwardly-extending electrically conductive structures, and the other of the top electrodes being electrically coupled with the second graphene structure and with the other of the downwardly-extending electrically conductive structures.

10. The method of claim 9 wherein the forming of the upwardly-extending electrically conductive structures comprises:

deposition of metal-containing electrically conductive material along the sidewalls of the opening and across a bottom of the opening;

anistropically etching the electrically conductive material; and recessing the electrically conductive material relative to a top of the opening so that upper surfaces of the upwardly-extending electrically conductive structures are below the top of the opening.

11. The method of claim 10 wherein the forming of the second dielectric material comprises:

deposition of the second dielectric material along and over the upwardly-extending electrically conductive structures, and across a bottom of the opening; and anistropically etching the second dielectric material to form dielectric liners along sidewalls of the upwardly-extending electrically conductive structures, and to form dielectric spacers over the upwardly-extending electrically conductive structures.

12. The method of claim 11 wherein the top electrodes are formed directly on the dielectric spacers.

13. The method of claim 11 wherein the forming of the graphene structures comprises:

deposition of seed material along sidewalls of the dielectric liners and dielectric spacers; and epitaxial growth of graphene along the seed material.

14. The method of claim 13 further comprising anisotropically etching the seed material to remove the seed material from over tops of the dielectric spacers prior to growing the graphene.

15. The method of claim 13 wherein the graphene grows over tops of the dielectric spacers, and further comprising anisotropically etching the graphene to remove the graphene from over the tops of the dielectric spacers.

* * * * *